(12) United States Patent
Onoue

(10) Patent No.: US 6,388,189 B1
(45) Date of Patent: May 14, 2002

(54) SHIELD CASE

(75) Inventor: Masami Onoue, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/797,052

(22) Filed: Feb. 28, 2001

(30) Foreign Application Priority Data

Mar. 1, 2000 (JP) ..................................... 2000-056077

(51) Int. Cl.[7] ................................................. H05K 9/00
(52) U.S. Cl. .............................. 174/35 R; 174/35 GC; 361/816; 361/718; 361/752
(58) Field of Search .......................... 174/35 R, 35 GC; 361/800, 816, 818, 718, 752

(56) References Cited

U.S. PATENT DOCUMENTS 6,049,469 A * 4/2000 Hood, III et al. ............ 361/818

* cited by examiner

Primary Examiner—Dean A. Reichard
Assistant Examiner—Hung V Ngo
(74) Attorney, Agent, or Firm—Jay H. Maioli

(57) ABSTRACT

A metal shield case which encloses a circuit board 11 on which an electronic circuit part is mounted, shielding electromagnetic wave disturbance, wherein a tongue 15 is provided in a case cover 12a by a cutout in correspondence with a heat generating part 10 mounted on the circuit board 11, the tongue 15 being held in press contact with the heat generating part 10 to allow the heat of the heat generating part to escape to the shield case through the tongue, thereby achieving a heat dissipating effect.

2 Claims, 4 Drawing Sheets

SHIELD CASE

BACKGROUND OF THE INVENTION

1. Field of the Invention

The present invention relates to a shield case of a high frequency device such as a tuner portion consisting, for example, an input circuit, a high frequency amplification circuit and a frequency conversion circuit of a television receiver.

2. Description of the Related Art

Generally speaking, the high frequency device of the tuner portion of a television receiver consisting of an input circuit, high frequency amplification circuit, etc. is covered with a metal case consisting, for example, of a tin plate, to effect electromagnetic wave shielding for electromagnetic wave disturbance.

As shown in FIGS. 1 and 2, the metal case of this conventional tuner portion comprises a rectangular box-like frame body 2 surrounding a circuit board 1 on which the high frequency parts of the input circuit, the high frequency amplification circuit and the frequency conversion circuit are mounted, and upper and lower case covers 2a and 2b, consisting, for example, tin plates, covering the upper and lower openings of this frame body 2.

As shown in FIG. 2, there is provided in this frame body 2 of the metal case a partition 3 consisting of a predetermined metal plate, for example, a tin plate, and a predetermined number of contact portions 3a are provided at predetermined positions of this partition 3. Further, formed at positions corresponding to the contact portions 3a of the partition 3 are thin and narrow claws 4 whose forward ends are free ends, the forward ends abutting the contact portions 3a of the partition 3, being electrically and mechanically connected thereto, providing predetermined high frequency characteristics (shield effect).

And, as a radiating part for dissipating heat, a heat sink S consisting of a metal plate such as an aluminum plate is mounted to the semiconductor integrated circuit IC mounted on the circuit board 1.

In this way, in the high frequency device of the tuner portion of the television receiver, when the heat sink 5 is mounted as the heat dissipating plate to the semiconductor integrated circuit IC mounted on the circuit board 1 in the metal case 2, the heat generated from the integrated circuit IC is dissipated effectively. However, the heat sink 5 is a member which is separate from the semiconductor integrated circuit IC, and it is mounted to the integrated circuit IC, which is to be cooled at the time of assembly, by using an adhesive, an adhesive tape, a screw or the like, so that it is troublesome.

Further, regarding the semiconductor integrated circuit IC accommodated in the metal case 2, there is a limitation to the configuration of the heat sink 5 in the limited space in the metal case 2, so that it is difficult to achieve high efficiency in heat dissipation. Thus, when a relatively large heat sink is used, the efficiency in heat dissipation is improved. However, it sticks out from the metal case 2, so that shield effect is reduced by half. Further, during the transportation of the product, the portion sticking out is not held properly, with the result that the packing box has to be rather large.

SUMMARY OF THE INVENTION

The present invention has been made in view of the above problems. Accordingly, it is an object of the present invention to provide a shield case in which it is possible to achieve, with a single part, the electromagnetic wave shielding for electromagnetic wave disturbance and the heat dissipation for the heat generating part.

To achieve the above object, there is provided in accordance with the present invention a metal shield case which encloses a circuit board on which an electronic circuit part is mounted, shielding electromagnetic wave disturbance, wherein a tongue is provided in a part of the shield case surface by a cutout, the tongue being held in press contact with the surface of a heat generating part mounted on the circuit board.

In this way, in accordance with the present invention, a tongue provided in a part of the shield case surface is held in press contact with the heat generating part of the electronic circuit accommodated in the shield case, whereby it is possible to obtain a high frequency characteristic (shield effect) and a cooling effect.

DESCRIPTION OF THE PREFERRED EMBODIMENTS

An embodiment of the shield case of the present invention will now be described with reference to FIGS. 3 through 6. In this embodiment, the present invention is applied to the shield case of the high frequency device of a tuner portion of a television receiver consisting of an input circuit, a high frequency amplification circuit and a frequency conversion circuit.

Figure 1:
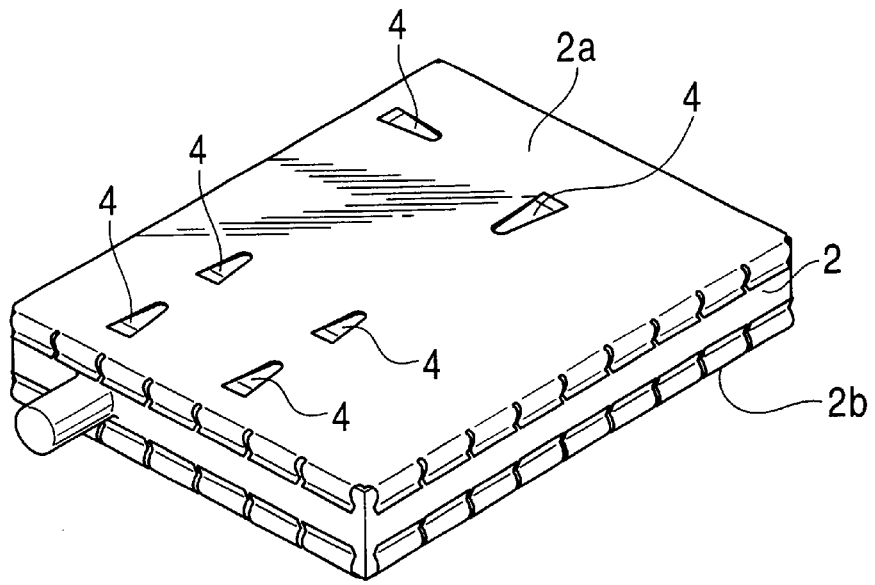
FIG. 1 is a perspective view showing a conventional example of a shield case.
Figure 2:
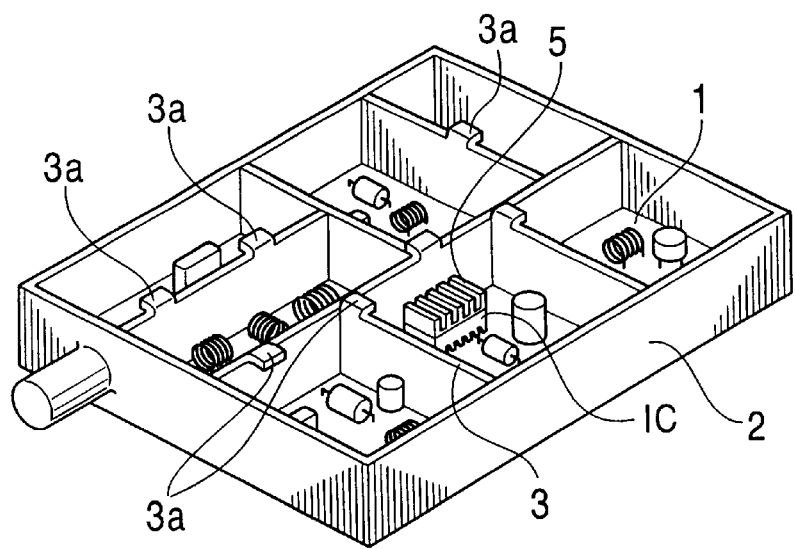
FIG. 2 is a perspective view of FIG. 1 with the upper case cover removed.

As in the metal case shown in FIGS. 1 and 2, in the shield case of this embodiment comprises a metal plate surrounding a circuit board 11 on which electronic parts of an input circuit, a high frequency amplification circuit and a frequency conversion circuit are mounted, for example, a frame body 12 consisting of a tin plate, and metal plates covering the upper and lower openings of this box-like frame body 12, an upper case cover 12a and a lower case cover (not shown) consisting, for example, of tin plates.

Figure 4:
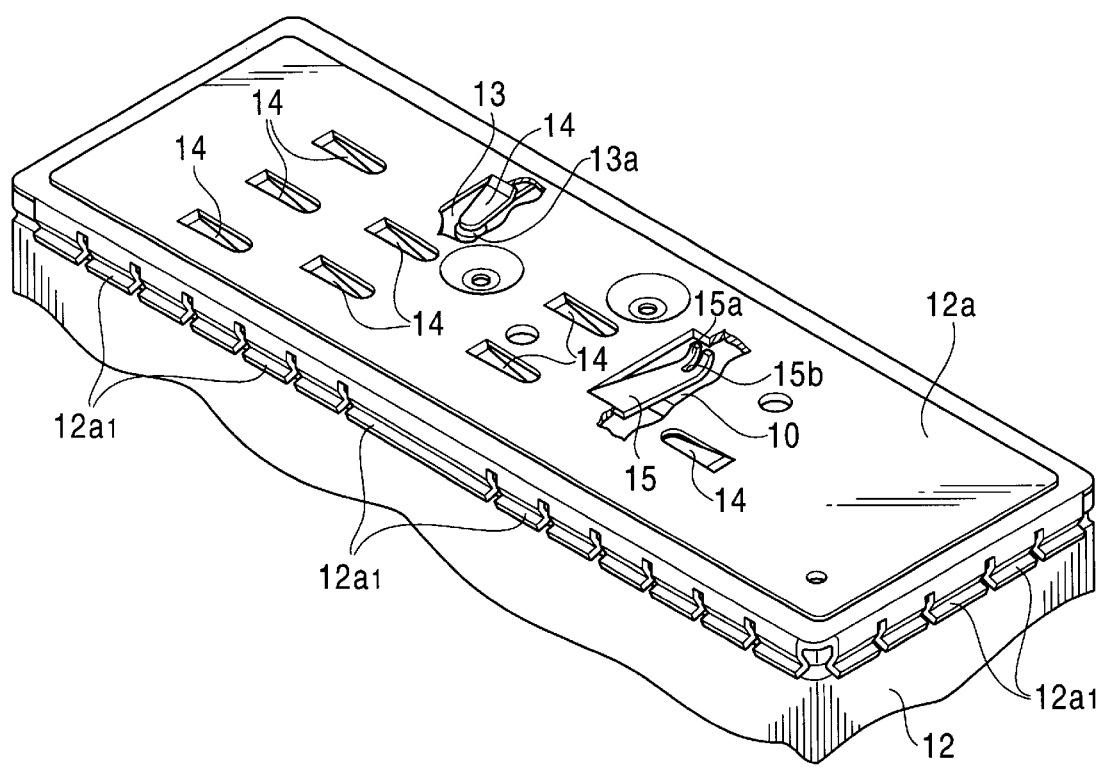
FIG. 4 is a partially omitted, partially cutaway perspective view of a shield case according to an embodiment of the present invention.
Figure 6:
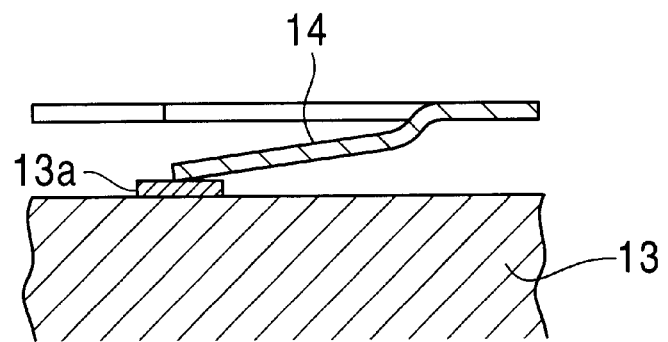
FIG. 6 is an enlarged sectional view of the grounding portion of FIG. 4.

In this frame body 12, there is provided at a predetermined position a partition 13 consisting of a predetermined metal plate, for example, a tin plate, as shown in FIGS. 4 and 6, and a contact portion 13a is provided at a predetermined position of the upper edge of this partition 13. Further, a thin and narrow claw 14 whose forward end is formed as a free end is formed in the upper case cover 12a at a position corresponding to the contact portion 13a of the partition 13, and this claw 14 is bent elastically and inwardly to bring the forward end thereof into contact with the contact portion 13a of the partition 13, connecting electrically and mechanically, making it possible to obtain a high frequency characteristic (shield effect).

Further, due to the elastic edge portion 12a 1 in the outer periphery thereof, the upper case cover 12a and the lower case cover are in contact with the frame body 12 so as to elastically hold the same, thereby securing the high frequency characteristic (shield effect).

In this way, in the region defined by the partition 13 in the frame body 12 whose upper and lower openings are covered by the upper case cover 12a and the lower case cover, there is arranged an electronic circuit part mounted on the circuit board 11, and a heat generating part 10 such as a semiconductor integrated circuit IC is incorporated in this electronic circuit part, and this heat generating part 10 must be cooled through heat dissipation.

Figure 3:
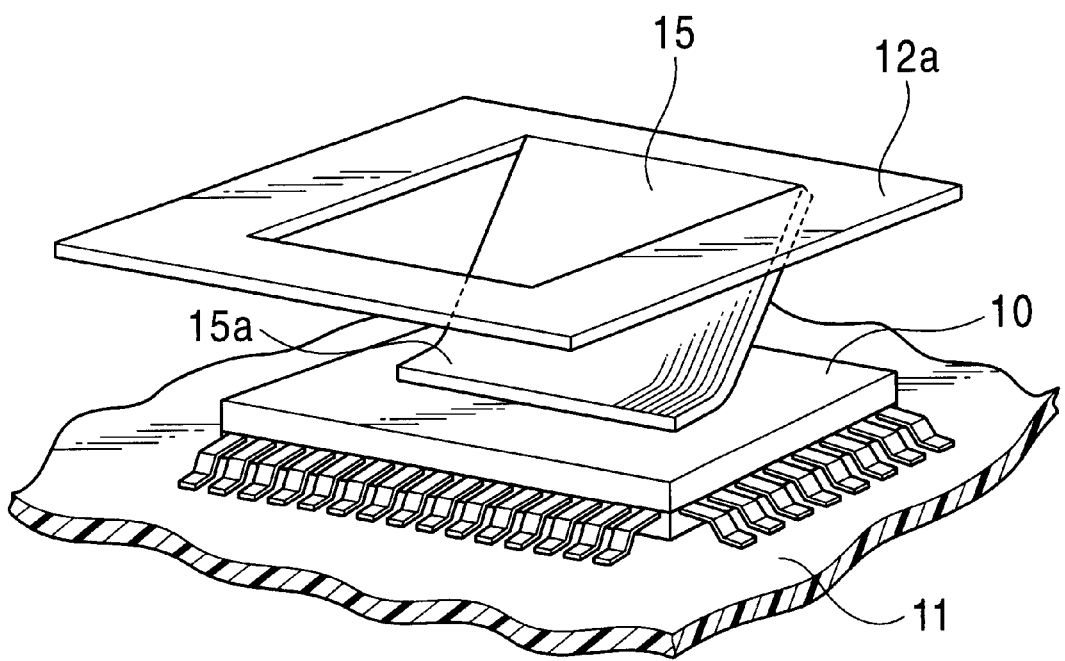
FIG. 3 is a schematic perspective view of a main portion of a shield case according to the present invention.
Figure 5:
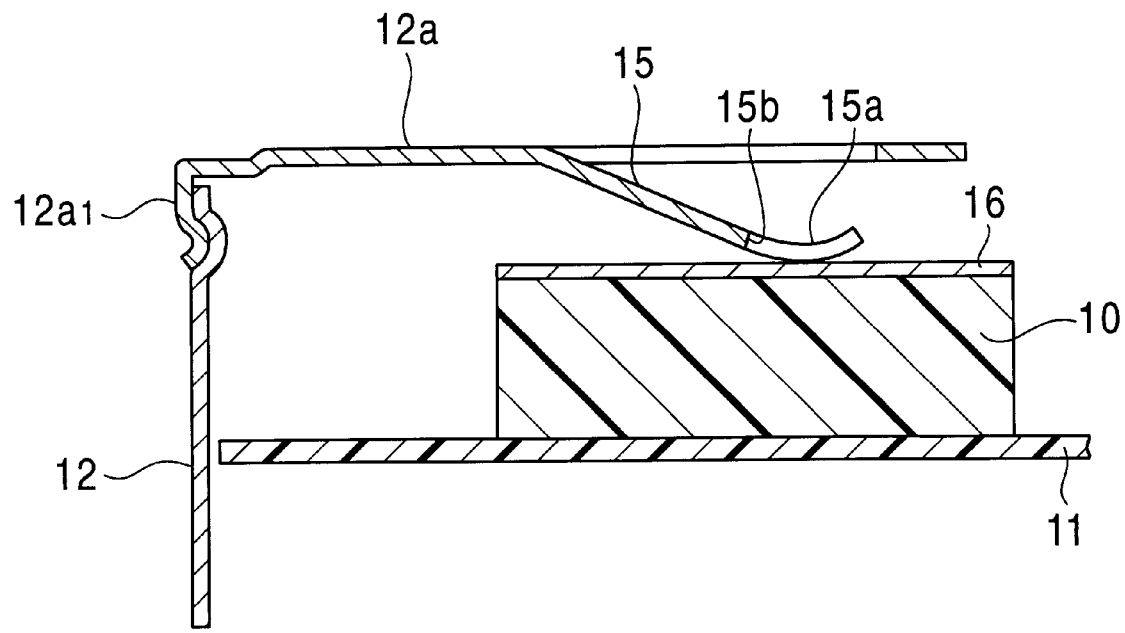
FIG. 5 is an enlarged sectional view of a main portion of FIG. 4.

Thus, in this embodiment, at a position directly over the heat generating part 10, for example, the semiconductor integrated circuit IC, mounted on the circuit board 11, a tongue 15 whose forward end is formed as a free end is formed in the upper case cover 12a by cutout as shown in FIGS. 3, 4 and 5, and this tongue 15 is bent inwardly and elastically, the forward end 15a thereof being elastically in press contact with the surface of the heat generating part 10 (semiconductor integrated circuit IC).

In this way, by holding the tongue 15 in press contact with the surface of the heat generating part 10 such as the semiconductor integrated circuit IC, the heat gathered in the heat generating part 10 is transmitted through the tongue 15 and the upper case cover 12a to the frame body 12, that is, the shield case, to be dispersed and dissipated, so that it is possible to obtain a cooling effect for the heat generating part 10. Further, in the cutout portion where the tongue 15 is formed, it is greatly opened on both sides of the tongue 15, whereby air circulation is established between the outside air and the interior, thereby achieving further heat dissipating effect in addition to the contact.

In this case, as shown in FIG. 5, in the case of a structure in which a heat transmission material 16 is applied to the surface of the heat generating part 10 (semiconductor integrated circuit IC), the forward end portion 15a of the tongue 15 is held in press contact with the surface of the heat generating part 10 through this heat transmission material 16, whereby it is possible to conduct heat dissipation of the heat generating part 10 more effectively.

Further, as shown in FIGS. 4 and 5, there is provided a longitudinal cutout groove portion 15b in the forward end portion 15a of the tongue 15, whereby the forward end portion 15a is divided into a plurality of portions, and the pressurization on the surface of the heat generating part 10 is effected flexibly and reliably, and the heat transmission from the heat generating part 10 is effectively conducted, making it possible to effect the heat dissipation reliably.

As described above, in the shield case of this embodiment, the claw 14 of the upper case cover 12a is held in contact with the partition 13 to effect connection electrically and mechanically, and the tongue 15 is held in press contact with the heat generating part 10 (semiconductor integrated circuit IC) to effect heat transmission, whereby it is possible to obtain a cooling effect due to the high frequency characteristic (shield effect) and heat dissipation.

Further, the claw 14 and the tongue 15 of the upper case cover 12a of the shield case are elastic, so that solely by fitting the upper case cover 12a into the upper opening of the frame body 12, the claw 14 is brought into contact with the partition 13 in the frame body 12, and the tongue 15 can be easily pressurized and fixed to the heat generating part 10 (semiconductor integrated circuit IC) in the frame body 12, so that the assembly is very easy and an improvement is achieved in terms of production efficiency. Further, without using any special gluing/fixing material such as an adhesive or an adhesive sheet, the tongue 15 as the cooling member can be fixed to the heat generating part 10, thereby making it possible to achieve a reduction in cost.

And, the cooling member for the heat generating part 10 does not stick out from the shield case, so that there is no need to change the outer dimensions of the shield case. Thus, there is no increase in the size of the product. Further, there is no need to greatly change the packing box for transportation as in the conventional case, in which a heat sink is adopted.

Further, the machining of the tongue 15 of the shield case can be conducted in the same manner as in the case of the existing grounding claw, so that there is no need to perform any special machining on the die for forming the case, and it is possible to form the shield case of the present invention without any extra investment.

While an embodiment of the present invention has been described above, the present invention is not restricted to this embodiment. Various modifications are possible without departing from the scope of the present invention.

For example, the configuration of the tongue held in press contact with the heat generating part is not restricted to that shown in the drawing. It can be arbitrarily changed in conformity with the configuration and size of the heat generating part. Further, this tongue is not necessarily formed in the case cover. It may also be formed in an arbitrary part of the shield case, for example, the frame body, that is, in a part corresponding to an electronic part that can generate heat including the heat generating part, and brought into press contact with this part, whereby heat dissipation is effected through heat transmission as in the above-described case, thereby achieving a cooling effect.

And, the shield case of the present invention can be applied to all types of broadcasting reception tuner, including a tuner for digital ground wave broadcasting reception, a tuner for digital cable broadcasting reception, a tuner for digital satellite broadcasting reception, a tuner for analog ground wave broadcasting reception, a tuner for analog cable broadcasting reception, and a tuner for analog satellite broadcasting reception, where a semiconductor integrated circuit IC for demodulation and amplification.

As described above, in accordance with the present invention, the tongue provided in the shield case surface is held in press contact with the surface of the heat generating part mounted on the circuit board, whereby it is possible to obtain an effect of cooling the heat generating part without using a heat sink. And, the tongue, which is a heat dissipating member, is held in a stable manner in press contact with the heat generating part without using an adhering material such as an adhesive or an adhesion seal, so that the assembly is very easy and the effectiveness in production is high. Further, the cost is remarkably reduced as compared with the cooling system in which a separate member such as a heat sink is used, and it is possible to achieve a reduction in the product size, so that the product is reduced in size and can be easily packed and transported.

Further, in the present invention, when the tongue of the shield case surface is held in press contact with the surface of the heat generating part through the intermediary of a heat transmitting material applied to the surface of the heat generating part, it is possible to achieve a still higher effect of cooling the heat generating part.

Further, in the present invention, by providing a longitudinal cutout groove portion in the forward end portion of the tongue of the shield case surface held in press contact with the heat generating part, the forward end portion of the tongue is divided into a plurality of parts and reliably and flexibly pressurized against the heat generating part, whereby the heat transfer from the heat generating part is effected efficiently and the cooling effect is improved.

What is claimed is:

1. A metal shield case enclosing a circuit board on which an electronic circuit part is mounted for shielding electromagnetic wave disturbance comprising a tongue provided in a surface of the shield case by a cutout, the tongue being held in press contact with a surface of a heat generating electronic circuit part mounted on the circuit board, wherein a longitudinal cutout groove portion is provided in a forward end portion of the tongue held in press contact with the heat generating electronic circuit.

2. The shield case according to claim 1, wherein the tongue is held in press contact with the surface of the heat generating electronic circuit part through the intermediary of a heat transmitting material applied to the surface of the heat generating part.

* * * * *